Nov. 11, 1969 T. W. CONRAD ET AL 3,478,301

LOW INSERTION FORCE CAM-ACTUATED PRINTED CIRCUIT BOARD CONNECTOR

Filed April 6, 1967 3 Sheets-Sheet 1

THOMAS W. CONRAD
WILLIAM McIVER
INVENTORS.

BY John J. Leavitt

AGENT

INVENTORS.
THOMAS W. CONRAD
WILLIAM MCIVER
By John J. Leavitt
AGENT

THOMAS W. CONRAD
WILLIAM MC IVER
INVENTORS.

BY John J. Leavitt

AGENT

United States Patent Office 3,478,301
Patented Nov. 11, 1969

3,478,301

LOW INSERTION FORCE CAM-ACTUATED PRINTED CIRCUIT BOARD CONNECTOR

Thomas Wesley Conrad, Altadena, and William McIver, Garden Grove, Calif., assignors to International Telephone and Telegraph Corporation, New York, N.Y., a corporation of Maryland Filed Apr. 6, 1967, Ser. No. 628,854
Int. Cl. H01r *13/62;* H05k *1/07*
U.S. Cl. 339—75 7 Claims

ABSTRACT OF THE DISCLOSURE

A printed circuit board electrical connector is provided in which insertion of the printed circuit board into the receptacle formed by the connector body automatically actuates cam members within the receptacle to displace the resilient contact members into electrical engagement with the associated printed circuit board terminals. Such engagement is effected after partial insertion but prior to complete insertion of the printed circuit board so as to provide a wiping action between each printed circuit board terminal and an associated resilient contact.

The invention relates generally to an electrical connector for printed circuit boards, and more particularly to an electrical connector in which insertion of the printed circuit board automatically effects engagement of the connector contacts with the printed circuit board contact terminals.

Background of the invention

Conventional printed circuit board connectors operate on the principle that resilient contact members normally strongly biased toward each other or toward the printed circuit board will be resiliently displaced away from each other or in a direction away from the board by insertion of the printed circuit board into the receptacle. The inherent resilience of the contact material is depended upon to provide a predetermined and requisite contact pressure. Experience has taught that the resilient contact fingers are frequently stressed beyond their elastic limit, resulting in unreliable connections, and the frictional effect of the resiliently biased contact fingers abrade the conductive strip on the circuit board, causing destructive wear. It is therefore one of the objects of the invention to provide an electrical connector in which the resilient contacts are normally biased away from the printed circuit board so as to minimize the insertion force required to insert the printed circuit board into the receptacle.

It is another object of the invention to provide an electrical connector in which insertion of the printed circuit board is substantially completed before physical engagement is made between the resilient contacts and the circuit board terminals so as to minimize relative movement between the parts at a time when the frictional forces involved are greatest, thus decreasing destructive wear.

A still further object of the invention is the provision of an electrical connector in which insertion of the printed circuit board automatically effects displacement of the resilient contacts into engagement with the printed circuit board contact terminals.

One of the factors which has resulted in less than reliable electrical contact between a printed circuit board terminal and an associated resilient contact has been the tendency of the conductive strip forming the printed circuit to acquire a coating of electrically non-conductive oxide. It is accordingly another of the objects of this invention to effect contact in a manner which will cause the resilient contact to break through such oxide coating and reliably engage the base metal beneath the oxide coating.

It is a still further object of the invention to provide in an electrical connector a multiplicity of aligned resilient contact fingers arranged in a series in association with appropriate cam means actuated automatically by insertion of the printed circuit board to displace the resilient contact fingers into engagement with the printed circuit board contact terminals.

A still further object of the invention is to provide an electrical connector for printed circuit boards incorporating an overtravel provision to effect locking of the circuit board in the connector.

The invention possesses other objects and features of advantage, some of which, with the foregoing, will be apparent from the following description and the drawings. It is to be understood however that the invention is not limited to the embodiment chosen for illustration, as it may be embodied in various form within the scope of the appended claims.

Summary of the invention

In terms of broad inclusion, the electrical connector of the invention comprises an elongated hollow body forming a receptacle, preferably fabricated from a synthetic resinous material having a high degree of dimensional stability, and an appropriate dielectric constant. The elongated receptacle includes within its interior a pair of longitudinally extending and parallel shafts, each having spaced therealong a plurality of cam lobes or surfaces spaced to correspond with the spacing of resilient contact fingers extending into the hollow interior of the receptacle substantially perpendicular to the axis of rotation of the cam shafts. Spaced on each side of the resilient contact fingers are levers or lugs adapted to be engaged by the inner edge portion of a printed circuit board inserted into the receptacle to a first depth somewhat less than a predetermined maximum depth. Continued inward movement of the printed circuit board against the levers or lugs pivots the cam lobes and brings the resilient contact fingers into engagement with the terminals on the printed circuit board. Movement of the printed circuit board to its final position effects locking of the resilient contact fingers in resilient engagement with associated terminals on the printed circuit board. During this final thrust of the printed circuit board, during which the contacts are in physical engagement with the printed terminals on the circuit board, the pressure is sufficient to effect a wiping action of the electrical contact against the printed terminal to effect breaking of the oxide coating thereon.

Description of preferred embodiment

Figure 1:
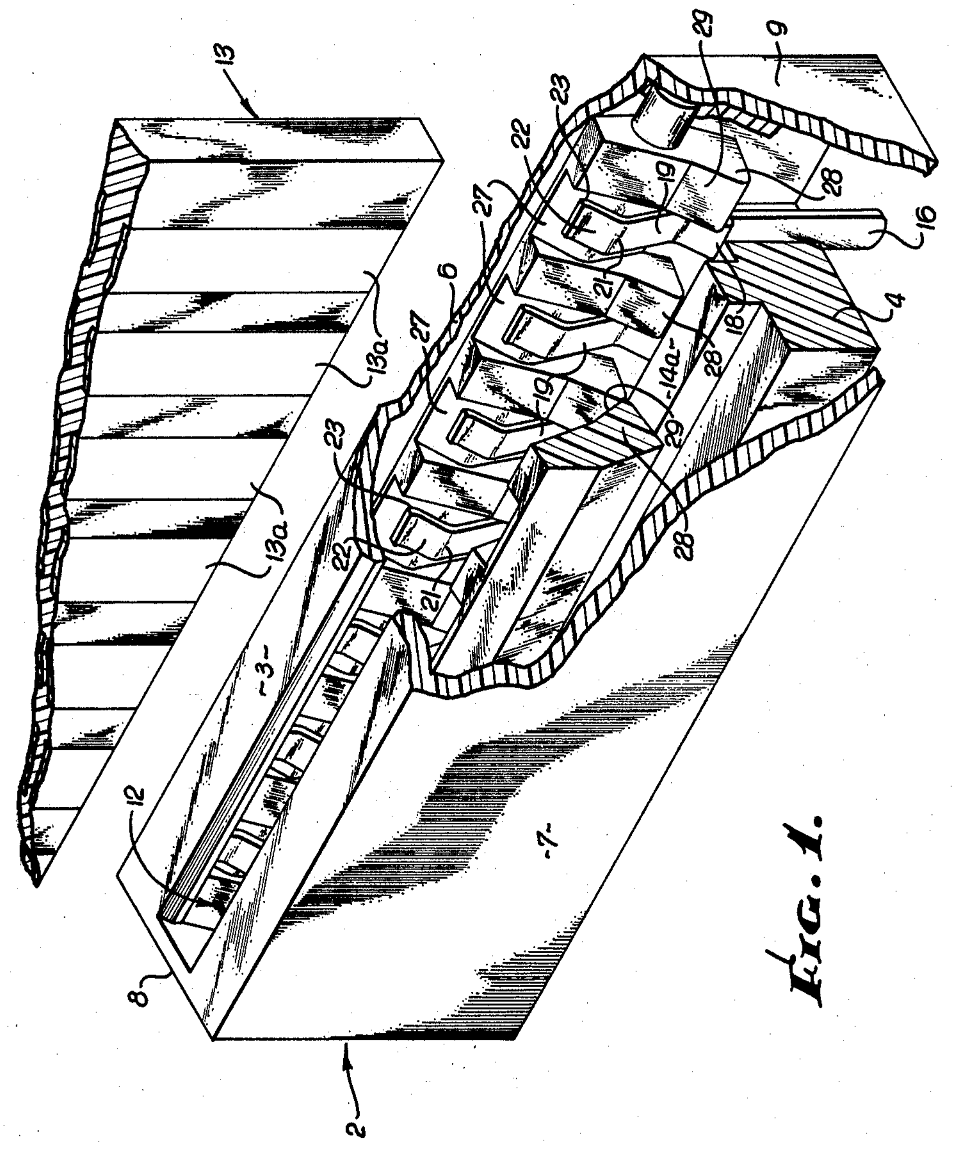
FIG. 1 is a perspective view, with portions of the connector body broken away and shown in section to reveal the internal relationship of the parts. A portion of a printed circuit board is shown in association with the electrical connector.

In terms of greater detail, the cam-operated electrical connector of the invention comprises an elongated hollow body or receptacle designated generally by the numeral 2, and having a front wall 3 and rear wall 4, connected by side walls 6 and 7 and end walls 8 and 9. The front wall 3 is preferably provided with a centrally disposed elongated aperture 12 proportioned to snugly receive a printed circuit board 13 therein. The circuit board is provided with appropriate contact terminal portions **13*a***.

As shown in the drawings, the rear wall of the receptacle is provided on its inner surface 14 with a projecting rib **14*a***. The rib functions as a limit stop for the associated printed circuit board in a manner which will hereinafter be more fully explained.

The rear wall is also provided with appropriate apertures through which extend electrical conductors 16, each terminating within the hollow interior 17 of the receptacle. Within the hollow interior of the receptacle each of the electrical conductors is bent inwardly toward a central plane coincident with and including the longitudinal axis of the receptacle, to provide a shoulder 18 abutting the inner surface 14 of the rear wall. From the shoulder, each electrical conductor comprises an elongated resilient metallic strip-like contact portion 19, bent to provide a convex contact surface 21 intermediate the relatively long and relatively resilient arm 19 and a shorter cam-follower section 22 which is relatively less resilient than portion 19, and the extreme end of which terminates in a convex bearing surface 23 as shown.

Figures 2, 3, 4:
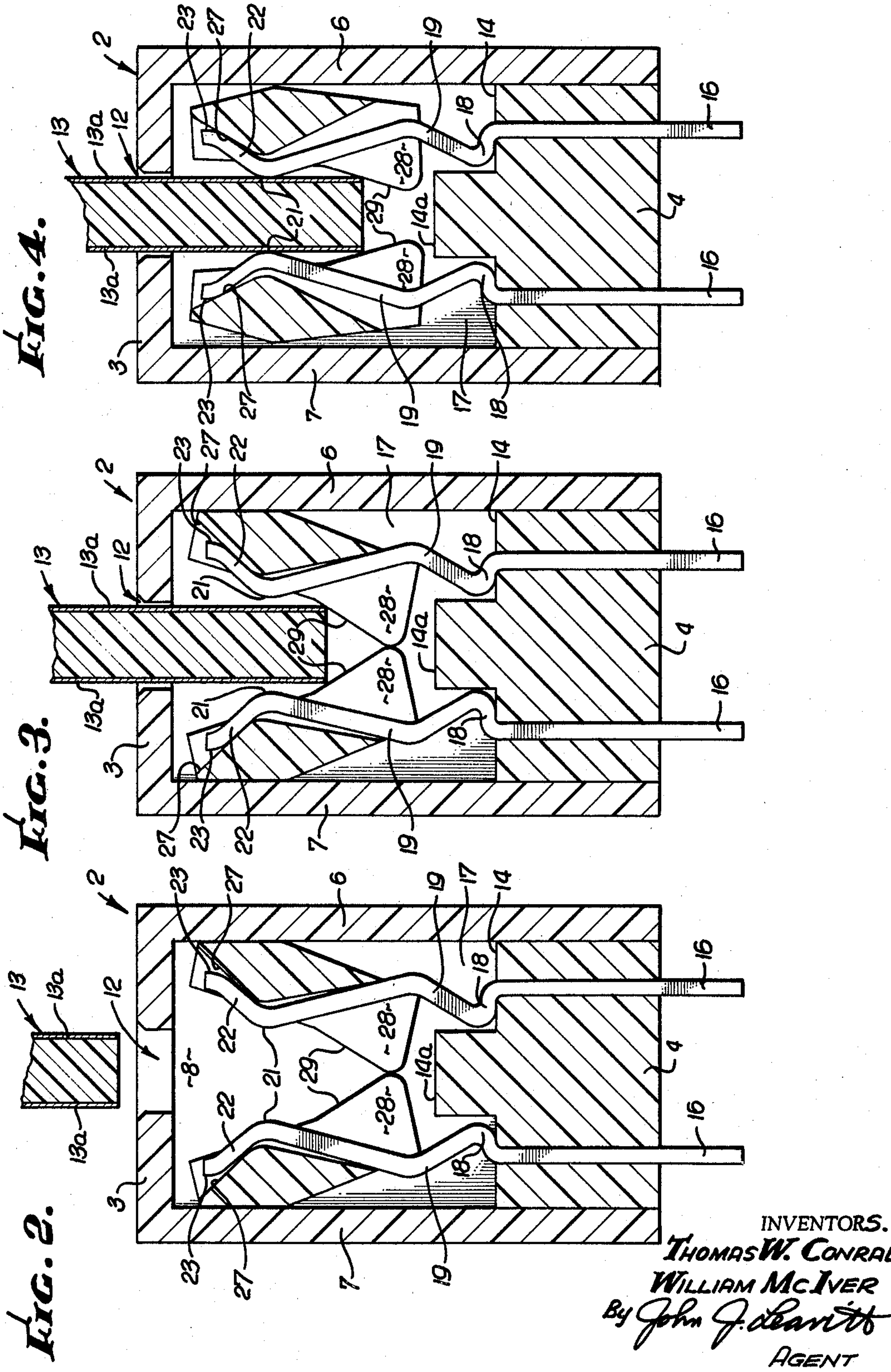
FIG. 2 is a cross-sectional view illustrating the resilient contact fingers within the receptacle in their normal unbiased position. A portion of a printed circuit board is shown to the left of the figure prior to insertion into the receptacle.
FIG. 3 is a cross-sectional view similar to FIG. 2, but showing the printed circuit board partially inserted into the receptacle to a first depth and into light abutment with the levers which project into the path of the circuit board and rotatable thereby to displace the resilient contact fingers into engagement with the printed circuit board contact terminals.
FIG. 4 is a cross-sectional view similar to FIG. 3, but showing the printed circuit board inserted into the receptacle to a second depth at which the lever arms have been displaced sufficiently to cam the resilient contact fingers into light physical engagement with the printed circuit board contact terminals.

In the position of the parts illustrated in FIGS. 1–3, the resilient strip-like metallic contact portions 19 of the electrical conductors are biased outwardly toward the side walls by the inherent resilience of the contact material. To bring the contact surfaces 21 into electrically conductive engagement with the associated printed circuit board terminal portions **13*a***, the resilient contact strips must be biased inwardly toward each other and toward the printed circuit board as viewed in FIG. 3, against the inherent resilience of the strip material.

To reduce to a minimum the insertion force required to insert the printed circuit board into the receptacle, it is preferred that the printed circuit board be permitted to pass into the receptacle for some distance prior to engagement of the contact surfaces 21 with the associated terminal conductors on the printed circuit board. To achieve this, a rotatable cam shaft is arranged between each series of resilient contact portions 19 and the associated side wall 6 or 7.

As best shown in FIG. 1, each cam shaft is suitably journaled on the receptacle body, and is provided along its length with cam surfaces 27, spaced along the cam shaft in correspondence to the spacing of the electrical contact portions 19.

Fixed to the cam shaft and disposed between adjacent cam surfaces 27, are a plurality of levers 28 which extend into the path of the printed circuit board to present inclined surfaces 29 adapted to be engaged by the end surface of the printed circuit board when it is inserted into the receptacle. The cooperative relationship between the printed circuit board and the levers 28 is best illustrated in FIGS. 3–6. As there shown, the levers associated with each series of resilient contact portions 19 extend past the lateral edges of the resilient contact portions 19 and function additionally to retain the resilient contact portions in proper alignment with respect to the associated conductive terminals of the printed circuit board.

Additionally, it will be noted that the levers 28 project on the opposite side of the axis of rotation from cam surfaces 27, and that these cam surfaces 27, which engage the adjacent bearing surfaes 22 of the resilient contact portions 19, move about the axis of rotation of the cam shaft in a direction opposite to the direction in which the levers move about such axis.

Accordingly, as viewed in FIG. 3, movement of the printed circuit board to the right from its position there shown, will effect divergent movement of the levers 28 on the opposed and parallel cam shafts, with the result that opposed cam surfaces 27 will move toward each other and impinge on portions 22, to effect resilient displacement of the contact portions 19 toward the printed circuit board. As shown in FIG. 3, the printed circuit board has been inserted to a first depth which is less than the predetermined maximum depth shown in FIG. 6, so that the printed circuit board merely lightly abuts the inclined surfaces 29 on the levers 28.

Figure 5:
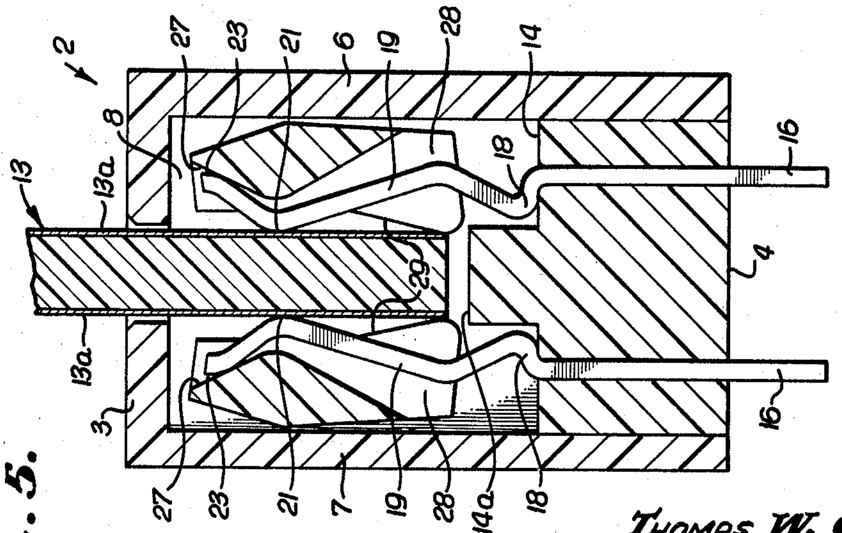
FIG. 5 is a cross-sectional view similar to FIG. 4, but illustrating the printed circuit board inserted still further into the receptacle into a third position in which camming action has effected maximum displacement of the resilient contact fingers so as to impose maximum contact pressure.

In FIG. 4, the printed circuit board has been thrust further into the receptacle, to a second depth which is still less than the predetermined maximum depth, with the effect that the levers 28 have been moved apart, causing each of the cam shafts to rotate about its respective axis, and displace the cam surfaces 27 sufficiently to carry the contact surfaces 21 into light engagement with the terminal electrodes on the printed circuit board. It will thus be apparent that continued movement of the printed circuit board to the right, to a third depth still less than the predetermined maximum depth, as illustrated in FIG. 5, will not effect a further displacement of the resilient contact portion 19, but rather, will effect the imposition of an increasing force on the cam-follower sections 22, so as to increase the contact pressure of contact surfaces 21 on the associated conductive portion of the printed circuit board from substantially zero (FIG. 4) to a maximum contact pressure (FIG. 5) which will provide the desired minimal value of contact resistance. It is this increase in pressure, coincident with movement of the printed circuit board to the right, which effects a wiping action between the contact surfaces 21 and the associated conductive surfaces of the terminals on the printed circuit board. As previously discussed, such wiping action is desirable in order to cause the convex surfaces 21 to break through the oxide coating which forms on the printed terminals.

Figure 6:
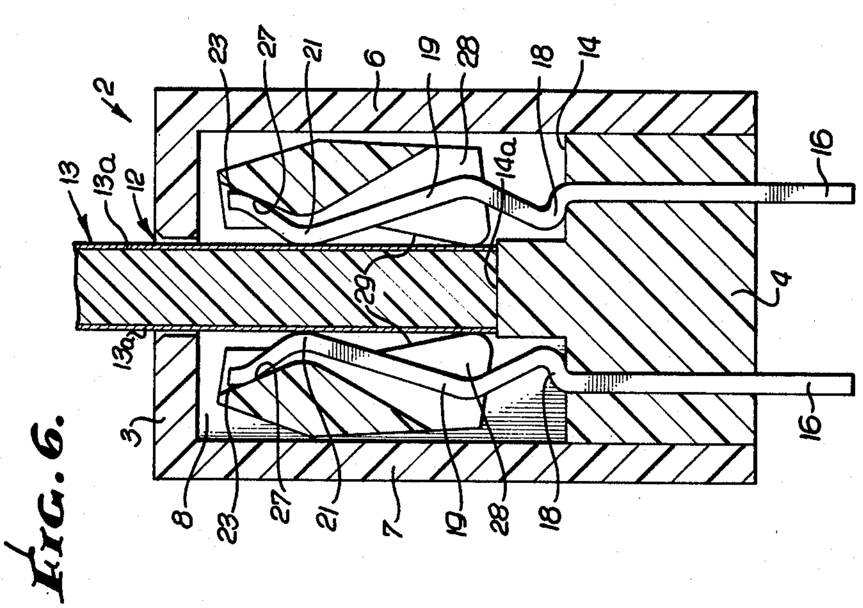
FIG. 6 is a cross-sectional view similar to FIG. 5, but illustrating the printed circuit board fully inserted into the receptacle and abutting the rear wall thereof to effect locking of the resilient contacts in engagement with the printed circuit board contact terminals.

As illustrated in FIG. 5, the depth to which the printed circuit board has been inserted has caused the cam shafts to rotate a maximum amount. The contact pressure exerted by contact surfaces 21, which has also been maximized, is determined by the thickness, configuration and inherent resilience of the cam-follower section 22 of each of the contact portions 19. As illustrated in FIG. 5, the printed circuit board has not yet been thrust to its predetermined maximum depth within the receptacle so as to bring it into abutting relationship with the rib **14*a* on the rear wall. This latter position of the parts is illustrated in FIG. 6, and clearly indicates that with the parts in this position, the printed circuit board lies locked within the receptacle by the resilient pressure imposed thereon by resilient contact portions 19, which lie locked in the position illustrated by impingement of levers 28** on the associated flat side surfaces of the printed circuit board.

From the foregoing description, it will be apparent that upon extraction of the printed circuit board from the receptacle, the printed circuit board need only move to the left a slight amount to permit the inherent resilience in the contact portions 19 to rotate the cam shafts in the opposite direction, thus relieving the contact pressure and attendant wear imposed on the printed circuit board and permitting it to be withdrawn with a minimum of force.

The embodiments of the invention in which an exclusive property or privilege is claimed are defined as follows:

1. A low insertion force electrical connector adapted to receive to a predetermined maximum depth an edge portion of a printed circuit board inserted thereinto and having at least one contact terminal thereon, comprising an elongated hollow receptacle arranged about a longitudinal axis and having apertured front and rear walls connected by side and end walls, a plurality of electrical conductors extending into the receptacle through an aperture in the rear wall to provide a resilient contact portion within the receptacle, the contact portion of said conductors normally lying in non-contacting relation with respect to a printed circuit board inserted thereinto to a first depth less than said predetermined maximum depth to reduce to zero the force required to insert the printed circuit board into the receptacle to said first depth, and contact actuator means within the receptacle responsive to insertion of the printed circuit board beyond said first depth to effect displacement of the resilient contact portion into electrically conductive engagement with an associated contact terminal on the printed circuit board, said contact actuator means comprising a cam shaft rotatably journaled within the receptacle and having lobes thereon disposed adjacent associated resilient contact portions, levers fixed on the cam shaft between each of said lobes and extending into the path of the printed circuit board and pivotally displaced thereby, rotation of the cam shaft being responsive to insertion of the printed circuit board beyond said first depth so that upon rotation of the shaft each lobe displaces an associated resilient contact portion into engagement with the printed circuit board.

2. The combination according to claim 1, characterized in that a plurality of electrical conductors extend into the receptacle to provide pairs of opposed resilient contact portions spaced on opposite sides of the longitudinal axis of the receptacle.

3. The combination according to claim 2, characterized in that said contact actuator means displace all contact portions simultaneously so as to simultaneously place all resilient contact portions in electrically conductive engagement with associated contact terminals on the printed circuit board.

4. The combination according to claim 2, characterized in that a pair of contact actuator means are provided rotatably disposed about parallel axes and operably associated with the pairs of opposed resilient contact portions, both said actuator means being actuated simultaneously upon insertion of the printed circuit board beyond said first depth.

5. The combination according to claim 4, characterized in that the resilient contact portions constitute cantilevers anchored in the rear wall and configured to provide a resilient section generally perpendicular to a longitudinal axis and inclined inwardly toward the printed circuit board, said resilient inclined section merging with an outwardly extending cam-follower portion terminating adjacent the associated actuator means.

6. The combination according to claim 4, characterized in that electrical contact between the resilient contact members and the printed circuit board contact terminals is effected prior to insertion of the printed circuit board to said predetermined maximum depth.

7. The combination according to claim 6, characterized in that insertion of the printed circuit board beyond the point where the resilient contacts are caused to engage the printed circuit board effects an increase in the contact pressure exerted by each resilient contact.

References Cited

UNITED STATES PATENTS

| | | | |
|---|---|---|---|
| 2,811,700 | 10/1957 | Kuch | 339—17 |
| 3,188,598 | 6/1965 | Pferd | 339—17 |

FOREIGN PATENTS

| | | |
|---|---|---|
| 885,040 | 12/1961 | Great Britain. |

REINALDO P. MACHADO, Primary Examiner

P. C. KANNAN, Assistant Examiner

U.S. Cl. X.R.

339—176